United States Patent [19]
Snider et al.

[11] Patent Number: 5,867,063
[45] Date of Patent: Feb. 2, 1999

[54] GAIN DISTRIBUTION CIRCUIT

[75] Inventors: James Roderick Snider, Elk Grove Village; David M. Gonzalez, Elgin; Alexander Wayne Hietala, Cary, all of Ill.

[73] Assignee: Motorola, Inc.

[21] Appl. No.: 760,767

[22] Filed: Dec. 5, 1996

[51] Int. Cl.$^6$ ..................................................... H03G 3/30
[52] U.S. Cl. ........................ 330/133; 330/134; 330/279; 455/234.2; 455/241.1
[58] Field of Search .................................... 330/129, 133, 330/134, 278, 279; 375/345; 455/234.1, 234.2, 241.1, 245.2, 247.1, 251.1, 253.2

[56] References Cited

U.S. PATENT DOCUMENTS

| | | | |
|---|---|---|---|
| 4,774,474 | 9/1988 | Beauducel et al. | 330/129 |
| 4,775,988 | 10/1988 | Chevillat et al. | 375/345 |
| 5,204,977 | 4/1993 | Feldt | 455/234.2 |
| 5,376,895 | 12/1994 | Aihara | 330/133 X |
| 5,432,473 | 7/1995 | Mattila et al. | 330/133 |

*Primary Examiner*—James B. Mullins
*Attorney, Agent, or Firm*—Randall S. Vaas

[57] ABSTRACT

A system (100 or 200) includes a first AGC stage (102) having a programming input and a gain input. A second AGC stage (104 or 210 and 234) is coupled in a common path with the first AGC stage, the second AGC stage having a programming input and a gain input. The first and second AGC stages are programmed by respective programming signals to produce independent gain characteristics responsive to a common gain signal at their respective gain inputs.

4 Claims, 4 Drawing Sheets

GAIN DISTRIBUTION CIRCUIT

FIELD OF THE INVENTION

The present invention pertains to gain control in a system employing more than one automatic gain control (AGC) element.

BACKGROUND OF THE INVENTION

In any integrated circuit (IC) employing multiple automatic gain control (AGC) stages, a tradeoff is typically made when setting the gain in the different stages. For example, in a wireless communication system, the receiver may employ two AGC stages. The output of the first AGC stage is mixed with an intermediate carrier frequency signal to step it down to the baseband frequency. The baseband signal is then filtered. The filtered signal is passed through a second AGC stage. The distribution of the total gain between these two AGC stages has an impact upon the noise figure and the intermodulation distortion.

The noise figure is the measure of the noise introduced by the receiver. The noise figure will determine the ability of the receiver to process weak signals. The intermodulation distortion will determine the receiver's ability to process strong signals.

In general, a system which has little attenuation of the input signal before an active gain stage will have a superior noise figure but may be susceptible to interference due to intermodulation distortion. On the other hand, a system which attenuates the input signals before application to the active gain stages will have superior intermodulation performance since the signal level at the active gain stages will be lower. Unfortunately this attenuation will add to the noise figure and thus reduce the system's sensitivity to weak signals.

In designing an IC, accommodating for this classic tradeoff between the noise figure and intermodulation distortion can become very expensive and time consuming. If the proper balance cannot be reached for the many different users of the IC, then many versions of the IC may have to be created and maintained. Additionally, in attempting to adapt the IC to a particular application, the tradeoff may have to be changed as the system design progresses. In this case the IC will need to be modified each time a new tradeoff is identified. Inasmuch as an IC fabrication cycle is on the order of 8 weeks, redesigning the IC introduces a substantial delay in the development of the system IC and adds significantly to the engineering cost.

Accordingly it is desirable to provide a more flexible IC design for systems employing multiple AGC stages.

DETAILED DESCRIPTION OF THE DRAWINGS

Figure 1:
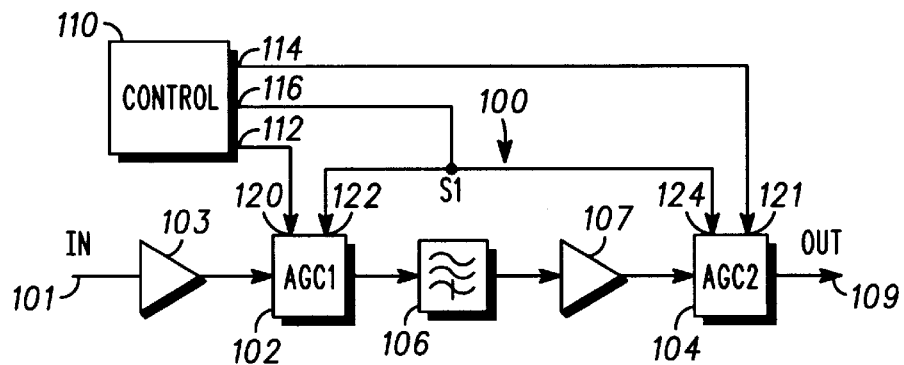
FIG. 1 is a circuit schematic in block diagram form illustrating a path including multiple AGC stages.

A system 100 (FIG. 1) has in input 101 for connection to a signal source (not shown). The input is passed through a preamplifier 103, which buffers the input signal. An input automatic gain control (AGC) stage 102, receives the input signal and outputs a signal to a filter 106. The filtered signal is passed trough a buffer amplifier 107 and applied to an output AGC stage 104. The output of AGC stage 104 is the path output 109. The AGC stages can be implemented using any suitable amplifier (not shown) having a variable gain set by a control current input to the gain control input thereof.

A gain control circuit 110 generates programming signals at outputs 112 and 114 for the AGC stages 102 and 104, respectively. The programming signal for AGC stage 102 is received at input 120. The programming signal for AGC stage 104 is received at input 121. The gain control signal is received at inputs 122 and 124 of AGC stages 102 and 104, respectively. The programming signal selects the attenuation range for the AGC stage. The programming signals can be two bit binary signals. The total path gain and the gain distribution before and after the filter 106 are adjusted by the respective programming signals. The gain of the two AGC stages 102 and 104 is controlled, and thus their attenuation level is adjusted, by a common gain control signal SI. The common gain control signal S1 for the path is output by gain control circuit 110 at output 116.

The combination of the AGC stages 102 and 104 (FIG. 1) needs to provide sufficient attenuation to produce an output signal at a predetermined level for all input levels that are specified for the system 100.

Figure 2:
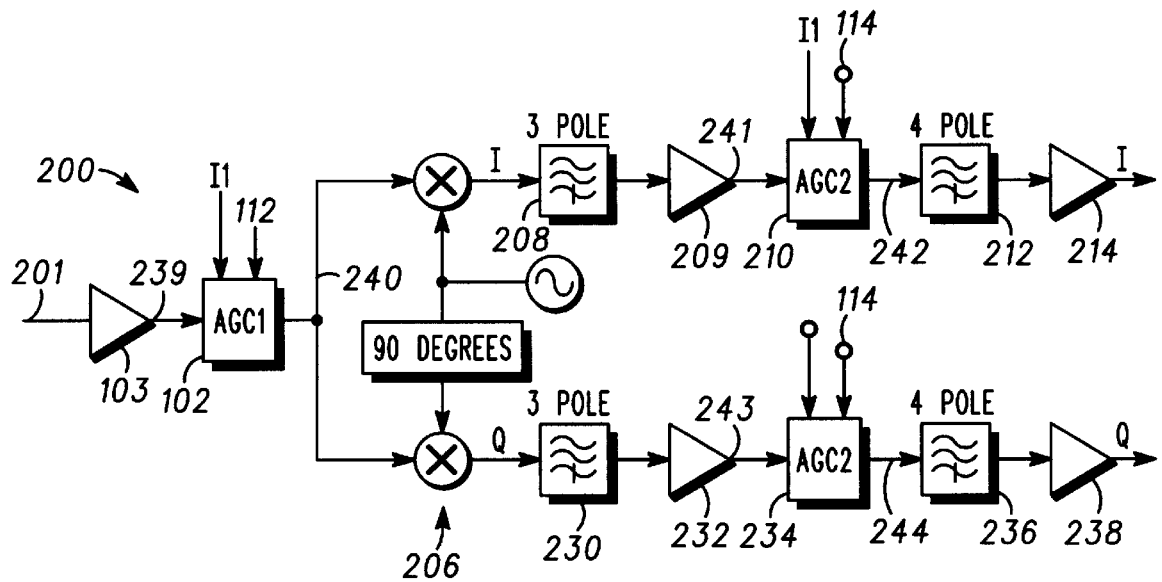
FIG. 2 is a circuit schematic in block diagram form illustrating a receiver including multiple AGC stages.

The system 100 can be advantageously implemented in a wireless receiver system 200 illustrated in FIG. 2. This receiver has an input 201 coupled to an antenna (not shown) which detects signals. The system 200 may be employed in a pager, a cordless telephone, a satellite telephone, a cellular telephone, or the like. The system may for example be an intermediate frequency (IF) section of a cellular telephone receiver, and passes signals in the range of 100 to 200 MHz. The input signal is passed through a preamplifier 103, and input at input 239 to the front end, or input, AGC stage 102. The preamplifier and input AGC stage 102 are to fix the noise figure for the IF system. Any suitable preamplifier can be used for preamplifier 103.

The output 240 of the first AGC stage 102 is connected to a mixer 206. The output signal of input AGC stage 102 is mixed in mixer 206 to step the input signal down to a baseband frequency signal having an in-phase (I) component and quadrature (Q) component. The mixer can be implemented using any suitable mixer.

Following the mixer 206, the in-phase component is fed to a filter 208. Any suitable filter may be used, such as a 3-pole lowpass filter built using operation transconductance amplifiers (OTA). Active elements are preferably used so that inductors are not required, since integrated inductors are not practical. However, because filter 208 is constructed of active elements, it is typically susceptible to intermodulation distortion. Subsequent filters in the receive path are not as susceptible to intermodulation distortion since the signal will be lowpass filtered after passing through this stage.

After the filter 208, the signal is fed to an amplifier 209 and input to the input 241 of an output AGC stage 210. The amplifier 209 is a buffer and it can be implemented using any suitable commercially available amplifier.

The signal at the output 242 of the output AGC stage 210 is filtered in a filter 212. The filter 212 can be implemented by a 4 pole OTA filter. The output of the filter 212 is passed through an amplifier 214. The amplifier 214 can be implemented using any suitable commercially available amplifier. The signal output by the amplifier 214 is processed in a processor (not shown), such as a digital signal processor (DSP), a microcontroller, a microprocessor or the like.

The quadrature component at the output of mixer 206 is processed in an identical manner to the in-phase component. It is filtered in a filter 230, buffered in amplifier 232, adjusted in output AGC stage 234, filtered in a filter 236, and amplified in an amplifier 238. Output AGC stage 234 has an input 243 and an output 244. The circuit components in the quadrature path are preferably identical to those in the in-phase component path, and are not described in greater detail hereinbelow.

The classic tradeoff of noise figure and intermodulation distortion exists between AGC stage 102 and output AGC stages 210, 234. If the attenuation in AGC stage 102 is minimized, then the noise figure is minimized for best weak signal performance. If the attenuation in AGC stage 102 is maximized, then the intermodulation performance is maximized, but the noise figure is degraded.

Each of the combinations of the AGC stages 102 and 210, and AGC stages 102 and 234, needs to provide sufficient attenuation to produce an output signal at a predetermined level for all input levels that are specified for the system 200.

Figure 3:
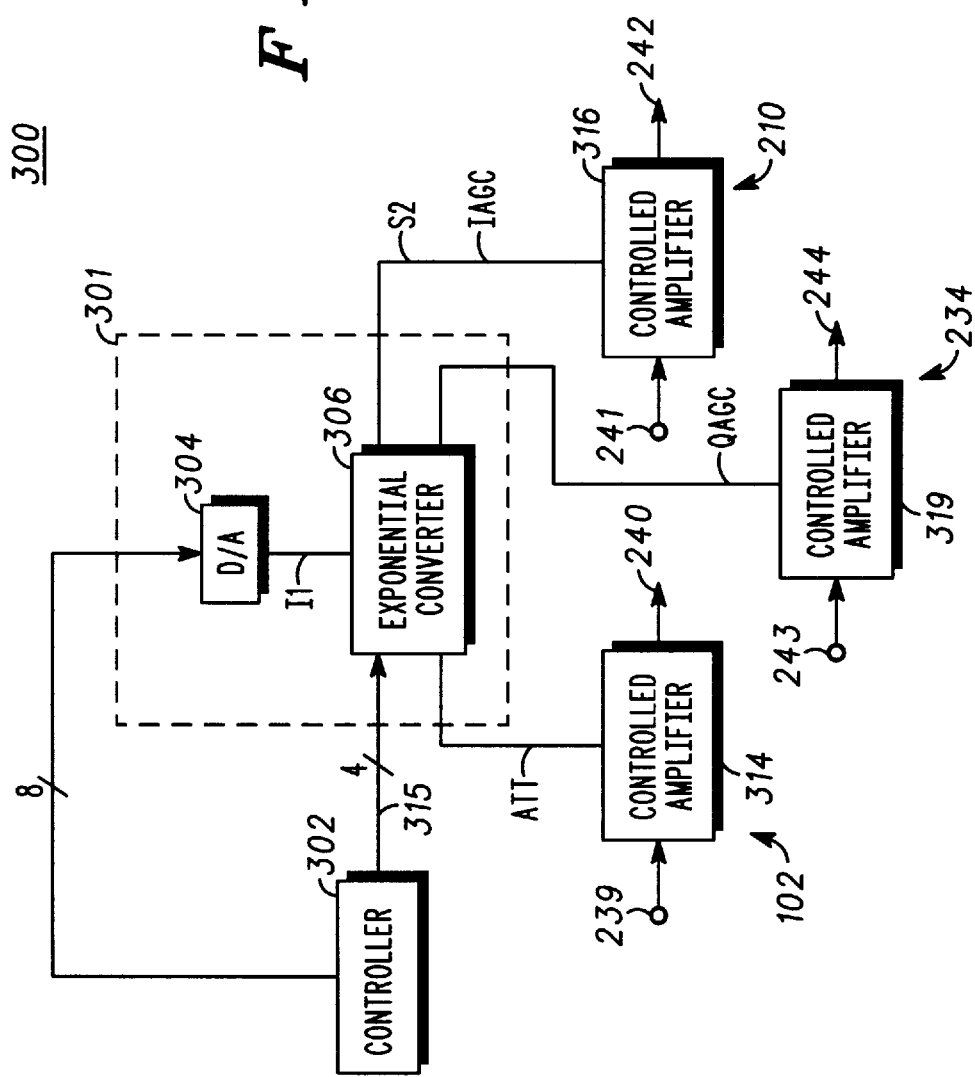
FIG. 3 is a circuit schematic in block diagram form illustrating AGC stages for the circuit of FIG. 2.

The AGC stages for the system 200 of FIG. 2 can alternately be implemented by circuit 300 (FIG. 3), coupled to a controller 302. The controller 302 is coupled to a gain allocation circuit 301 that is shared by AGC stages 102, 210, and 234. The gain allocation circuit 301 includes a digital-to-analog (D/A) converter 304, which can for example have an eight bit input. The controller 302 can be implemented using a microprocessor, a DSP, a microcontroller, a programmable logic unit, or the like. The D/A converter 304 is implemented using any suitable conventional D/A converter for converting digital signals I8 from the controller into an analog control signal I1. The D/A converter could alternately be part of controller 302.

The output I1 of the D/A converter 304 is an analog signal input to a programmable exponential converter, or current generator, 306. The programmable exponential converter circuit 306 converts the input analog signal I1 into gain control currents ATT for the input AGC stage 102, current IAGC for output AGC stage 210, and QAGC for output AGC stage 234. The control currents ATT, IAGC and QAGC have an exponential relationship to the signal I1 output by D/A converter 304.

Two programming signals are input to the exponential converter circuit 306 on programming signal bus 315. One programming signal permits setting the total gain of amplifier 314 of AGC stage 102. The other control signal controls the gain of amplifiers 316 and 319 of output AGC stages 210 and 234. The relationship of ATT, IAGC, and QAGC to I1 is such that linear increases in I1 result in exponential increase of ATT, IAGC, and QAGC. This exponential relationship results in linear changes in gain in amplifiers 314, 316 and 319 as measured in decibels.

Figure 4A:
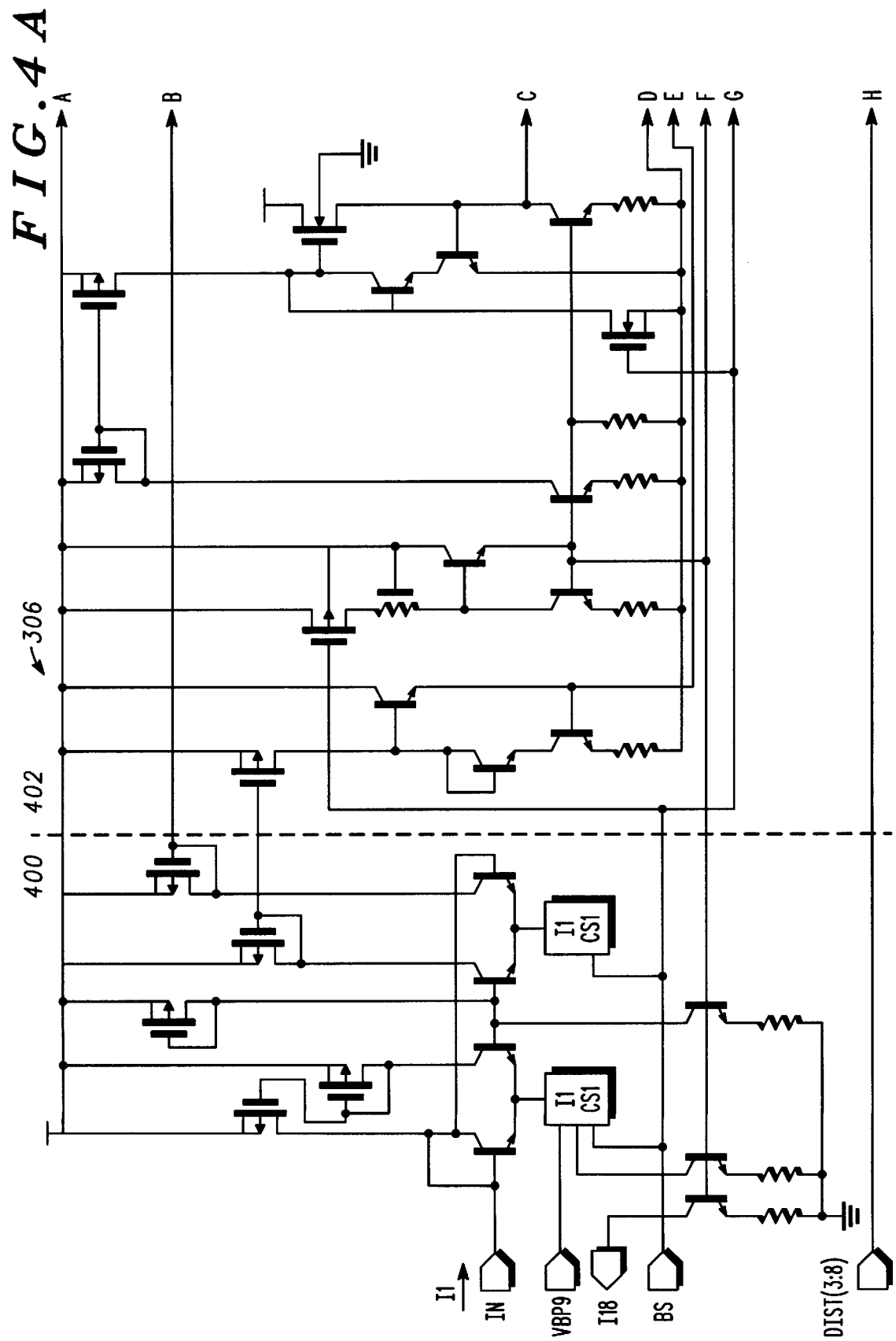
FIGS. 4 circuit schematic illustrating an exponential converter.
Figure 4B:
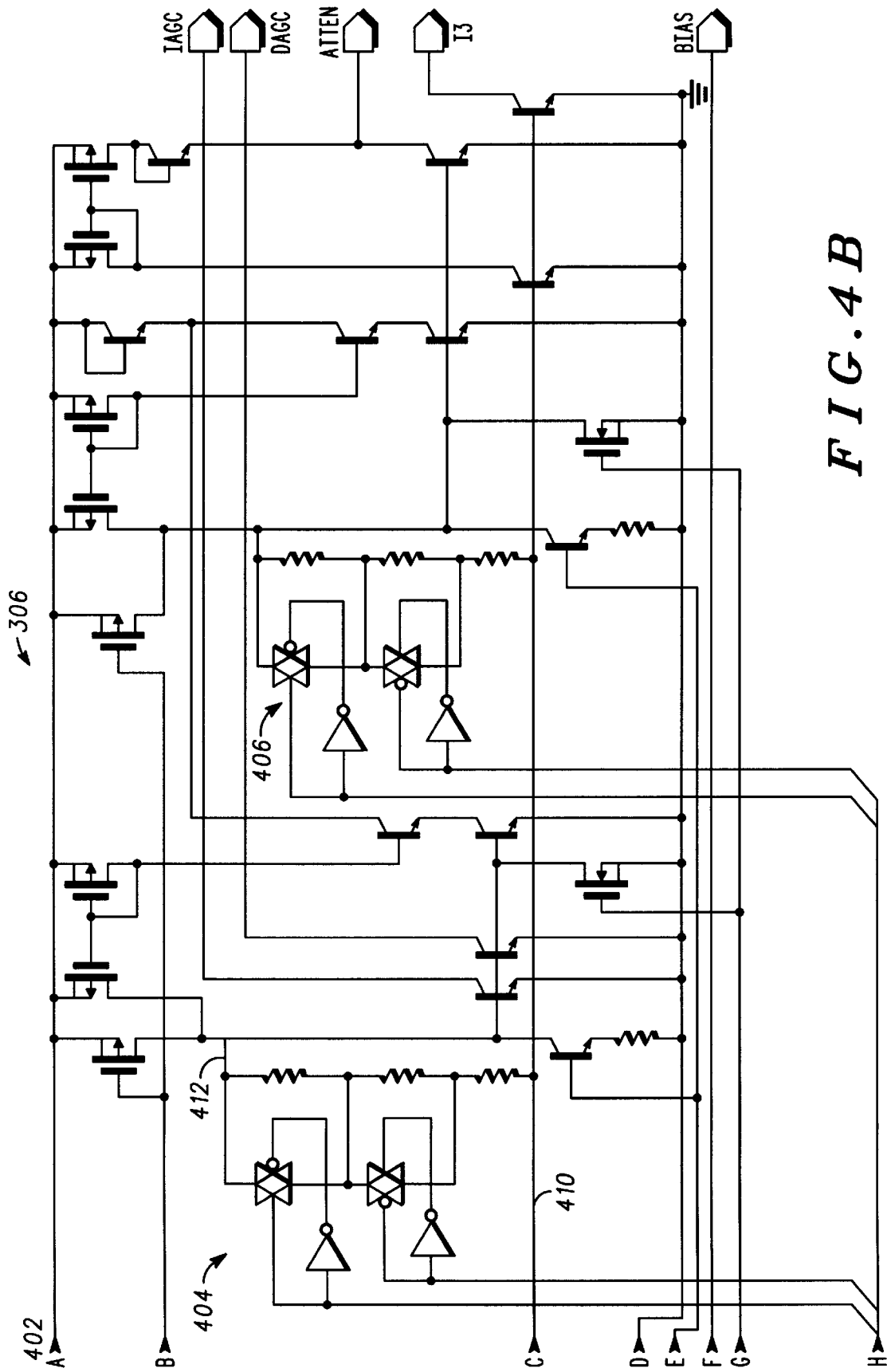

A circuit for implementing the programmable exponential converter is illustrated in FIG. 4. This circuit includes a multiplying amplifier 400 and an exponentiation circuit 402. For brevity, all of the components of the circuit are not described, as their operation is readily apparent to those of ordinary skill in the art by reviewing the circuit schematic.

The exponentiation circuit 402 includes a first variable impedance circuit 404 and a second variable impedance circuit 406. The variable impedance circuit 404 can be implemented using any suitable circuit elements, such as resistors, MOSFET elements, or a combination thereof, or the like. However, use of the three resistors R8, R8A and R8B and switches I9 and I10, permits two binary signals controlling switches I9 and I10 to select one of 4 different impedance values by selectively shorting one, both or neither of resistors R8A and R8B. The switches can be implemented using a transmission gate, such as MOSFET gate, having a control input that controls the switch to short a respective resistor or leave the resistor in the circuit. The variable impedance circuit 406 similarly includes resistors R9, R9A and R9B, and switches I3 and I4. It is envisioned that the variable impedance circuits 404 and 406, and the exponentiation transistors coupled thereto, can be implemented in the amplifiers 314, 316 and 319 instead of the exponential converter circuit 306.

In operation the voltage at terminal 410 is constant. The current through R8 is proportional to the current I1. The voltage at terminal 412 is the sum of the voltage at terminal 410 and the voltage across resistors R8, R8A, and R8B. This voltage is programmable by changing the resistance using switches I9 and I10. The output current IAGC is exponentially related to the base-emitter voltage $V_{BE}$ of transistor QN16. Because the emitter is connected to ground, $V_{BE}$ is the voltage at terminal 412. Accordingly, varying the impedance of R8 varies the voltage of 412, which varies the output current. Output currents IAGC and QAGC have the same value.

The output current IAGC thus depends upon the exponentiation of the D/A converter output current I1 multiplied by the impedance of the variable impedance circuit 404, and a constant K. I14 is the fixed collector current on QN14. IAGC is equal to I14 when the output current of D/A converter 304 is zero. IAGC rises exponentially as I1 rises, according the range set by impedance circuit 404, which is programmable.

The output current ATT is generated in the same manner as IAGC/QAGC. However, its value is set by variable impedance circuit 406.

The output current IAGC is connected to control the attenuation range of the amplifier 316 in AGC stage 210. The output QAGC is connected to control the attenuation range of the amplifier 319 in AGC stage 234. The output ATTN is connected to the amplifier 314 in AGC stage 102 to control the attenuation range thereof. The output QAGC can be omitted if only one output AGC stage is provided, as shown in FIG. 1.

It is envisioned that an 8-bit D/A converter 304 (FIG. 3) can be used to drive a current into exponential converter circuit 306. The exponential converter circuit 306 (FIG. 4) is responsive to this one input signal, I1, to drive control currents into amplifiers 314, 316 and 319. The control currents will vary attenuation of the amplifiers 314, 316 and 319.

The gain control provided by the exponential converter circuit 306 of FIG. 4 for the output AGC stage 210 can be expressed mathematically by the following calculations:

$$A_f = S_o/S_i = A_{Io} * I_2/I_{Ref}$$

where $A_f$ is the current gain of amplifier 316; So is the output level; $S^i$ is the input level; $A_{Io}$ is the minimum gain when $I_2$ is at its maximum value;

$I_{Ref}$ is a constant current inside of $A_f$; and $$A_{Irange} = I_{2max}/I_{2min}.$$

$$I_2 = I_{QN14} \exp(I_1 * (I_{CS2}/I_{CS1}) * (R_8/V_T))$$

where QN14 is the collector current of QN14;

I1 is the current into exponential converter circuit 306 at pin "IN" which is the current at the output of D/A converter 304;

ICS2 is the current flowing into CS2 at its "out" pin;
ICS1 is the current flowing into CS1 at its "out" pin;
R8 is the impedance of variable impedance circuit 404, established by resistors R8, R8A and R8B as programmed by switches I9 and I10 (i.e., the sum of these resistors which are not shorted by the switches I9 and I10); and $V_T$ is $KT/q = 26mV((T+273)/300)$.

$$A_{Irange} = \exp((I_{1max} - I_{1min}) * (I_{CS2}/I_{CS1}) * (R_8/V_T));$$

where $A_{Irange}$ is the range of the gain for the amplifier 316; $I_{1max}$ is the maximum current I1 at the output of D/A converter 304; and $I_{1min}$ is the minimum current I1 at the output of D/A converter 304.

$I_{CS2} = 3V_T \ln(4)/1.8K$ $I_{CS1} = 4*VCC/(3*60K)$ where Vcc is the power supply voltage of 2.75 Volts.

$$I_1 = 2*Vcc*N/(3*44K*256)$$

where N is the D/A input, $I_{1max}$ occurs when N=255, and $I_{1min}$ occurs when N=0.

Substituting these expressions into $A_{Irange}$ gives:

$$A_{Irange} = \exp(2*Vcc*N/(3*44K*256)* (3V_T \ln(4)/1.8K)*(3*60K/4*Vcc)*(R_8/V_T))$$

$$A_{Irange}(dB) = 20\log_{10}(A_{Irange}) = 20*(255)*$$

$$R_8 * 3 * \ln(2) * 60K/(256*(44K)*(1.8K)) * \log_{10}(e)$$

$A_{Irange}(dB) = R_8/1.1K * 15dB$ where $R_8 = 1.1K * X$ and X=1, 2, 3 or 4 for R8, R8+R8A, R8+R8B, and R8+R8A+R8B, respectively.

The total attenuation range of AGC stage 234 is the same as that of AGC stage 210. The total attenuation range of amplifier 314 is set by a similar mathematical relationship, but set by the impedance of variable impedance circuit 406 as programmed by the programming bits input thereto.

From the above, it can be seen that the resulting AGC programmability is achieved by tour bits output by the controller 302 in bus 315. For example, the four bit signal on bus 315 can produce the following gain relationships, where AGC2 represents the total attenuation range of each of the amplifiers in AGC stages 210 and 234 in the system of FIG. 2 and AGCL represents the total attenuation range of AGC stage 102 in FIG. 2:

TABLE 1

| Bits on 315 | AGC1 | AGC2 | Total for Path |
| --- | --- | --- | --- |
| 0000 | 60dB | 30dB | 90dB |
| 0001 | 60dB | 60dB | 120dB |
| 0010 | 60dB | 15dB | 75dB |
| 0011 | 60dB | 45dB | 105dB |
| 0100 | 30dB | 30dB | 60dB |
| 0101 | 30dB | 60dB | 90dB |
| 0110 | 30dB | 15dB | 45dB |
| 0111 | 30dB | 45dB | 75dB |
| 1000 | 45dB | 30dB | 75dB |
| 1001 | 45dB | 60dB | 105dB |
| 1010 | 45dB | 15dB | 60dB |
| 1011 | 45dB | 45dB | 90dB |
| 1100 | 15dB | 30dB | 45dB |
| 1101 | 15dB | 60dB | 75dB |
| 1110 | 15dB | 15dB | 30dB |
| 1111 | 15dB | 45dB | 60dB |

By making the gain of AGC stages 102, 210, and 234 programmable, then the system designer can alter the tradeoff easily, without redesigning the circuit. The is accomplished by setting the four bits of the programming signal when the IC incorporating the circuit is manufactured for an application. Also the same IF amplification circuit (system 200) can be used in many different communication systems by selecting the appropriate gain allocation using the programming bits.

Thus it can be seen that a circuit is disclosed wherein the attenuation range of two AGC stages can be set independently where the AGC stages are responsive to a single control signal. This provides great flexibility to circuit designers without the necessity of generating two gain control signals. The circuit is implemented using relatively little die area, and permits adjustment of the allocation of gain amongst the stages.

We claim:

1. A gain allocating circuit comprising:
   a gain input to receive a gain control signal;
   a programming input for receiving a programming signal;
   a first output to couple to a control input of a first amplifier;
   a second output to couple to a control input of a second amplifier; and
   a generator supplying a first signal at the first output according to the programming signal and the gain control signal and generating a second signal at the second output according to the programming signal and the gain control signal, wherein levels of the first and second signals can be independently set, the generator including a first variable impedance circuit coupled to the gain input and a second variable impedance circuit coupled to the gain input, the first and second variable impedance circuits including switches and impedance elements, the switches coupled to the impedance elements for controlling an impedance of each impedance element according to the programming signal, the first variable impedance circuit coupled to the first output to control the gain of the first amplifier and the second variable impedance circuit coupled to the second output to control the gain of the second amplifier.

2. A circuit comprising:
   a first AGC stage having a programming input and a gain input; and
   a second AGC stage coupled in a common path with the first AGC stage, wherein the second AGC stage has a programming input and a gain input, wherein the first and second AGC stages are programmed by first and second programming signals, respectively, to produce independent gain characteristics responsive to a common gain signal at their respective gain inputs.

3. The circuit as defined in claim 2, wherein the first AGC stage includes a first variable gain amplifier, an attenuation range of the first variable gain amplifier being set by the first programming signal and an attenuation level of the first variable gain amplifier being adjusted under control of the common gain signal.

4. The circuit as defined in claim 3, wherein the second AGC stage includes a second variable gain amplifier, an attenuation range of the second variable gain amplifier being set by the second programming signal and an attenuation level of the second variable gain amplifier adjusted under control of the common gain signal.

* * * * *